United States Patent
Zhao et al.

(10) Patent No.: US 6,297,555 B1
(45) Date of Patent: Oct. 2, 2001

(54) METHOD TO OBTAIN A LOW RESISTIVITY AND CONFORMITY CHEMICAL VAPOR DEPOSITION TITANIUM FILM

(75) Inventors: Joe W. Zhao, San Jose; Wei-Jen Hsia, Sunnyvale; Wilbur G. Catabay, Saratoga, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/218,780

(22) Filed: Dec. 22, 1998

Related U.S. Application Data

(62) Division of application No. 08/889,839, filed on Jul. 9, 1997.
(51) Int. Cl.[7] ........................ H01L 23/52; H01L 21/4763
(52) U.S. Cl. ........................ 257/758; 257/764; 257/743; 257/744; 438/627; 438/643; 438/653
(58) Field of Search ........................ 257/764, 4, 359, 257/768, 774, 773, 751, 758, 743, 744; 438/627, 643, 653

(56) References Cited

U.S. PATENT DOCUMENTS

| | | | |
|---|---|---|---|
| 5,427,666 | 6/1995 | Mueller et al. | 204/192.17 |
| 5,498,569 * | 3/1996 | Eastep | 438/3 |
| 5,525,837 * | 6/1996 | Choudhury | 257/751 |
| 5,552,341 * | 9/1996 | Lee | 438/643 |
| 5,654,235 | 8/1997 | Matsumoto et al. | 438/643 |
| 5,747,116 * | 5/1998 | Sharan et al. | 427/534 |
| 5,776,830 | 7/1998 | Sumi et al. | 438/643 |
| 5,780,356 | 7/1998 | Kim | 438/627 |
| 5,843,842 * | 12/1998 | Lee et al. | 438/688 |
| 5,903,054 * | 5/1999 | Sardella | 257/751 |
| 5,998,296 * | 12/1999 | Saran et al. | 438/685 |

* cited by examiner

Primary Examiner—Charles Bowers
Assistant Examiner—Brook Kebede
(74) Attorney, Agent, or Firm—Beyer Weaver & Thomas

(57) ABSTRACT

A method of forming titanium nitride barrier layers that are highly conformal, have high step coverage and low resistivity through a two stage deposition process is described. Low temperature deposition of titanium nitride barrier layer provides material of high conformity and good step coverage but of high resistivity. High temperature deposition of titanium nitride barrier layer yields material of low resistivity. Thus, a titanium nitride barrier layer deposited in separate steps at low temperature and high temperature by the method of the present invention is particularly suited for use in modern devices of increasing density that are characterized by narrow and deep contact holes.

34 Claims, 9 Drawing Sheets

METHOD TO OBTAIN A LOW RESISTIVITY AND CONFORMITY CHEMICAL VAPOR DEPOSITION TITANIUM FILM

This is a Divisional application of copending prior application Ser. No. 08/889,839 filed on Jul. 9, 1997, the disclosure of which is incorporated herein by reference.

BACKGROUND OF THE INVENTION

1. The Field of the Invention

The present invention relates to semiconductor devices and methods for their construction. More particularly, the present invention relates to deposition of titanium nitride barrier layers in semiconductor devices. More specifically, the present invention provides titanium nitride barrier layers of low resistivity and high conformity.

2. The Background Art

Titanium nitride barrier layers are formed over silicon dioxide or glass layers such as an ILD (interlayer dielectric) or IMD (intermetal dielectric) which have contact holes or vias etched through them. In the case of an ILD the contact hole contacts a source or drain region in a single crystal silicon or silicide substrate. Some contact holes may also contact a polysilicon gate electrode.

Titanium nitride barrier layers are used for at least three purposes. First, they block diffusion of species between a single crystal silicon substrate and a metal in the contact hole. If significant amounts of metal find their way from the metal contact into the silicon substrate, the device can be destroyed. Second, the titanium nitride facilitates adhesion of tungsten (when that metal is used in a contact hole) during tungsten deposition processes. For this reason, the titanium nitride barrier layer is often referred to as a "glue" layer. Finally, when tungsten hexafluoride ($WF_6$) is used to deposit tungsten it may chemically attack the silicon substrate, thus damaging the semiconductor device. The titanium nitride barrier layer prevents $WF_6$ from reaching the single crystal silicon substrate where it could do such damage.

Deposition of titanium nitride typically takes place by a "metal organic chemical vapor deposition" reaction, sometimes referred to as MO-CVD. This process employs an organotitanium compound which thermally decomposes on the substrate to form titanium nitride. Usually ammonia is added to the gaseous reaction mix to act as a reducing agent. In most systems, the organotitanium compound is tetrakis (diethylamido) titanium (TDEAT). In some cases, tetrakis (dimethylamido) titanium (TDMAT) may be employed in its place.

It is important that the titanium nitride barrier layer be deposited conformally and with good step coverage. A conformally deposited layer has nearly equal thickness on the top and bottom horizontal surfaces of a trench as well as the vertical side walls of that trench.

Step coverage is defined as the ratio of the thickness of a deposited film at the bottom horizontal surface of a trench to the thickness of that layer at the top horizontal surface just outside of the trench. Thus, in FIG. 1, for example, the step coverage is given by the ratio of a lower film thickness 2 to an upper film thickness 4. In FIG. 1, a conformal film 6 (e.g., titanium nitride) is formed over a dielectric layer 8, which is in turn formed on a semiconductor substrate 10. Dielectric layer 8 has a contact hole 12 etched therein. Contact hole 12 has as a property an aspect ratio defined as its depth (vertical dimension) divided by its width (the horizontal extent of the opening at the top of the hole).

Insufficient conformal coverage and/or too small step coverage can lead to semiconductor device failure because the titanium nitride barrier layer inadequately serves one of its functions. For contact holes having relatively low aspect ratios and wide trenches, these problems are not significant. However, as device density increases and aspect ratios correspondingly increase, it becomes more difficult to deposit conformal layers with good step coverage. Generally, for MO-CVD of titanium nitride, lower deposition temperatures always provide higher step coverage. Thus, MO-CVD of titanium nitride can provide good step coverage of contact holes of aspect ratios on the order of 5:1 when the deposition temperatures are kept below about 300° C.

Unfortunately, titanium nitride barrier layers deposited at low temperatures suffer from certain problems. Most notably, the resistivity of these materials is too high, typically above about 1200 $\mu$Ohm-cm which degrades device performance by slowing signal transmission between devices. Although the mechanism responsible for the resultant high resistivity of titanium nitride barrier layer deposited at low temperature has not been conclusively established observations have been made that such titanium nitride barrier layer is more porous and has a higher oxygen content than barrier layers deposited at higher temperatures.

The chemical vapor deposition (CVD) of titanium nitride is carried out under vacuum conditions with low content of oxygen. However, oxygen and moisture may find their way into the titanium nitride barrier layer after the device is formed and removed from the CVD chamber. Thus, possibly, the porous, low density titanium nitride barrier layers deposited at lower temperatures more tenaciously retain oxygen and moisture than those barrier layers deposited at higher temperatures.

In any event, it has become apparent that as device size shrink and contact holes become increasingly narrow and deep, improved techniques for depositing titanium nitride barrier layers are required. Such improved techniques should provide titanium nitride barrier layers which are conformal, have good step coverage and low resistivity.

SUMMARY OF THE INVENTION

The present invention provides a method of forming titanium nitride barrier layers that are highly conformal, have good step coverage and low resistivity. This is accomplished by depositing the barrier layer in a two stage deposition process.

In one aspect, the present invention provides a method of forming a titanium nitride barrier layer on a partially fabricated electronic device by deposition of a first sublayer of titanium nitride at a lower temperature followed by deposition of a second sublayer of titanium nitride at a higher temperature. Typically, the higher temperature is about 50° C. greater than the lower temperature. In one embodiment, the lower temperature is between about 200° C. and about 300° C. In a more specific embodiment, the lower temperature is between about 250° C. and about 300° C. In another embodiment, the higher temperature is between about 340° C. and about 500° C. In a more particular embodiment, the higher temperature varies between about 340° C. and about 400° C.

Preferably, the first titanium nitride sublayer is between about 50 Å and about 600 Å thick. In a more specific embodiment, the first titanium nitride sublayer is between about 100 Å and about 200 Å thick. Preferably, the second titanium nitride sublayer is between about 20 Å and about 200 Å thick. In a more particular embodiment, the second titanium nitride sublayer is between about 20 Å and about 100 Å thick.

In another embodiment, the titanium nitride barrier layer is formed by MO-CVD of a mixture of organotitanium compound, ammonia and a carrier gas. In a more specific embodiment, the pressure of the gaseous mixture varies between about 0.5 torr and about 80 torr. In another embodiment, the flow rate of the organotitanium compound, which is usually TDEAT or TDMAT, varies between about 0.1 standard cubic centimeters per minute (sccm) and about 10 sccm. In yet another embodiment, the flow rate of ammonia is between about 3,000 sccm and about 40,000 sccm.

Preferably, the titanium nitride barrier layer is formed in a multi-stage CVD reactor. The partially fabricated electronic device is moved between the stages such that each of the first and second titanium nitride sublayers are formed in one or more different stages. In another embodiment, the multi-stage CVD reactor contains at least six stages. In a yet more specific embodiment, the multi-stage CVD reactor contains at least one or two stages for forming the second titanium nitride sublayer.

In another aspect, the present invention provides a semiconductor device that includes a titanium nitride barrier layer formed by depositing a first sublayer of titanium nitride of a higher resistivity at a lower temperature followed by depositing a second sublayer of titanium nitride of a lower resistivity at a higher temperature. Generally, such devices are formed in accordance with the method described above.

In another aspect, the present invention provides a semiconductor device that includes a titanium nitride barrier layer comprised of two sublayers formed on a dielectric layer. In this aspect the device may be formed by any suitable method. The first titanium nitride sublayer which is deposited directly onto the dielectric layer has higher resistivity and a lower density than the second titanium nitride layer which is deposited on top of the first titanium nitride barrier layer. In one embodiment, the resistivity of the first titanium nitride sublayer is between about 2000 $\mu$Ohm-cm and about 1600 $\mu$Ohm-cm. In another embodiment, the resistivity of the second titanium nitride sublayer is between about 200 $\mu$Ohm-cm and about 600 $\mu$Ohm-cm. In another embodiment, the resistivity of the titanium nitride barrier layer is between about 1000 $\mu$Ohm-cm and about 200 $\mu$Ohm-cm. In yet another embodiment, the first titanium nitride sublayer is more porous than the second titanium nitride sublayer.

Preferably, the first titanium nitride sublayer is between about 50 Å and about 600 Å thick. Preferably, the second titanium nitride sublayer is between about 20 Å and about 200 Å thick.

The titanium nitride barrier layer of this invention finds particular use when formed on vias or contact holes having an aspect ratio larger than about 3.5:1. Preferably, the titanium nitride barrier layer has a step coverage of at least 60% and most preferably about 80%.

These and other features and advantages of the invention will be described below in the Detailed Description with reference to the Drawings.

DETAILED DESCRIPTION OF SPECIFIC EMBODIMENTS

Figure 1:
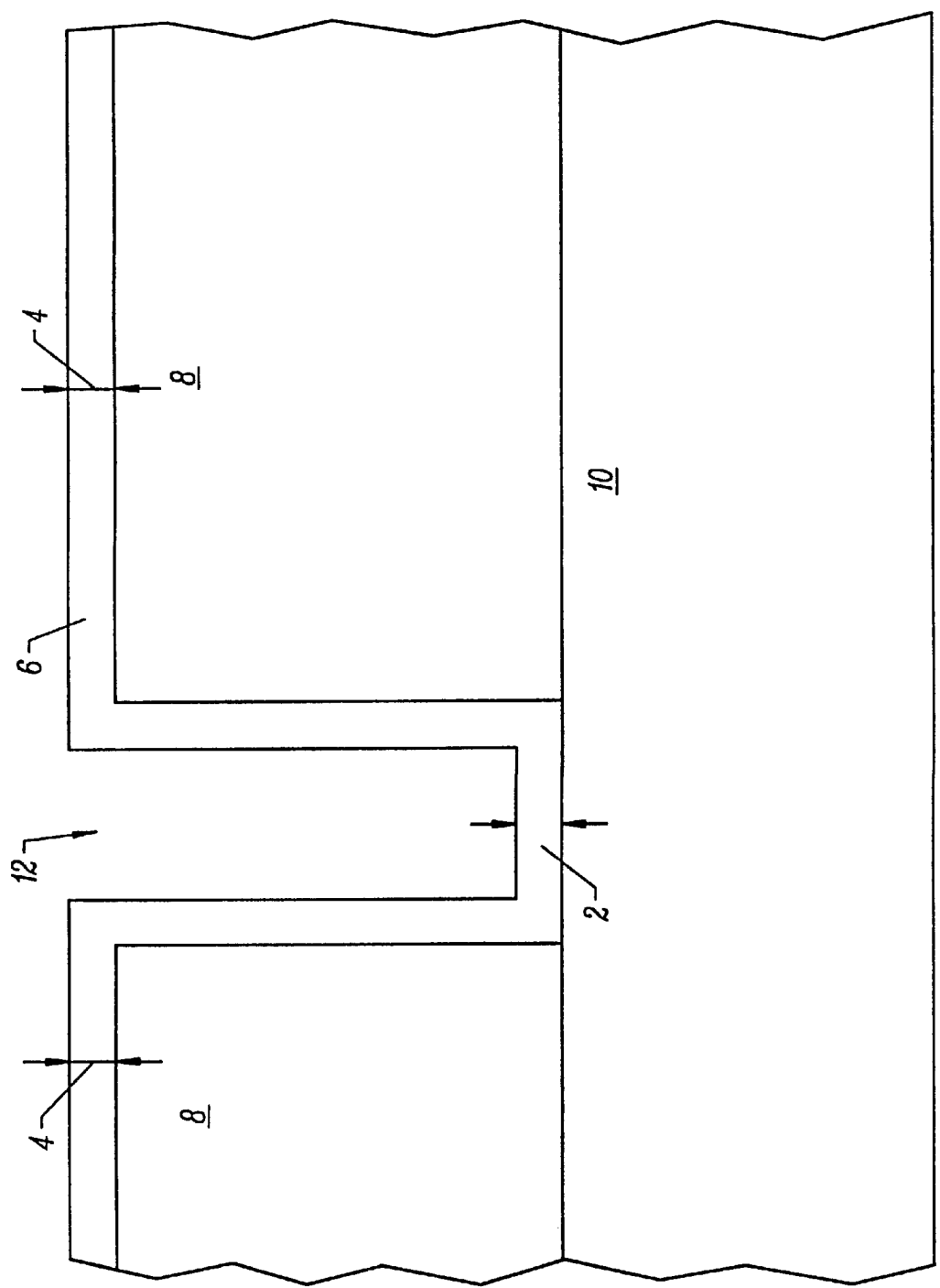
FIG. 1 shows a cross sectional view of a conformal barrier film on a dielectric layer that includes a contact hole or via formed on a semiconductor substrate.
Figure 2A:
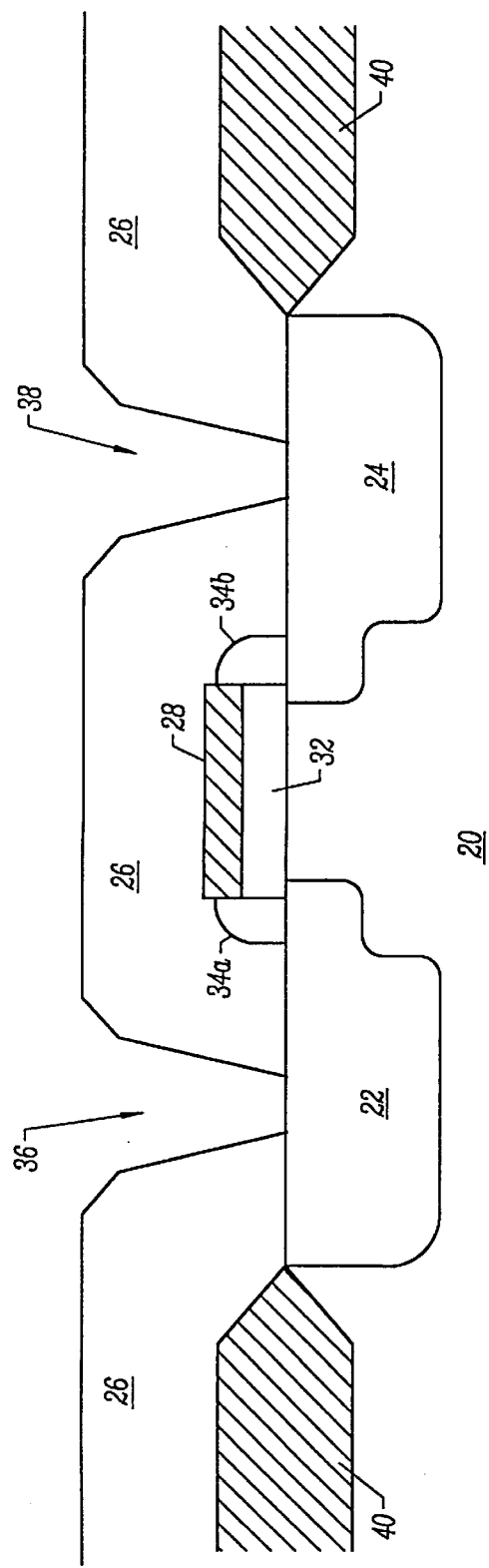
FIG. 2A shows a cross sectional view of a MOS transistor.

A specific embodiment of the present invention will be described with reference to FIGS. 2A–2D. FIG. 2A is a cross sectional view of a partially fabricated MOS of the n or p type or a CMOS semiconductor device. The device includes a semiconductor substrate 20 on which are formed a source 22 and a drain 24. The source and drain semiconductor regions typically include lightly doped areas near the device channels. The partially fabricated device includes a gate electrode 28 and a gate oxide 32 which are straddled by spacers 34a and 34b. The partially fabricated semiconductor device includes an ILD layer 26 which is composed of conventional dielectric materials such as oxides and glasses such as a boron phosphosilicate glass and a field oxide region 40. Finally, the partially fabricated semiconductor device includes contact holes or vias 36 and 38 that have been etched into the ILD layer 26 down to source 22 and drain 24 respectively. Typically, contact holes 36 and 38 have an aspect ratio of about 2:1 or greater in modern integrated circuits. Those of skill in the art will recognize that the structure shown in FIG. 2A can be formed by conventional front end integrated circuit processes.

Figure 2B:
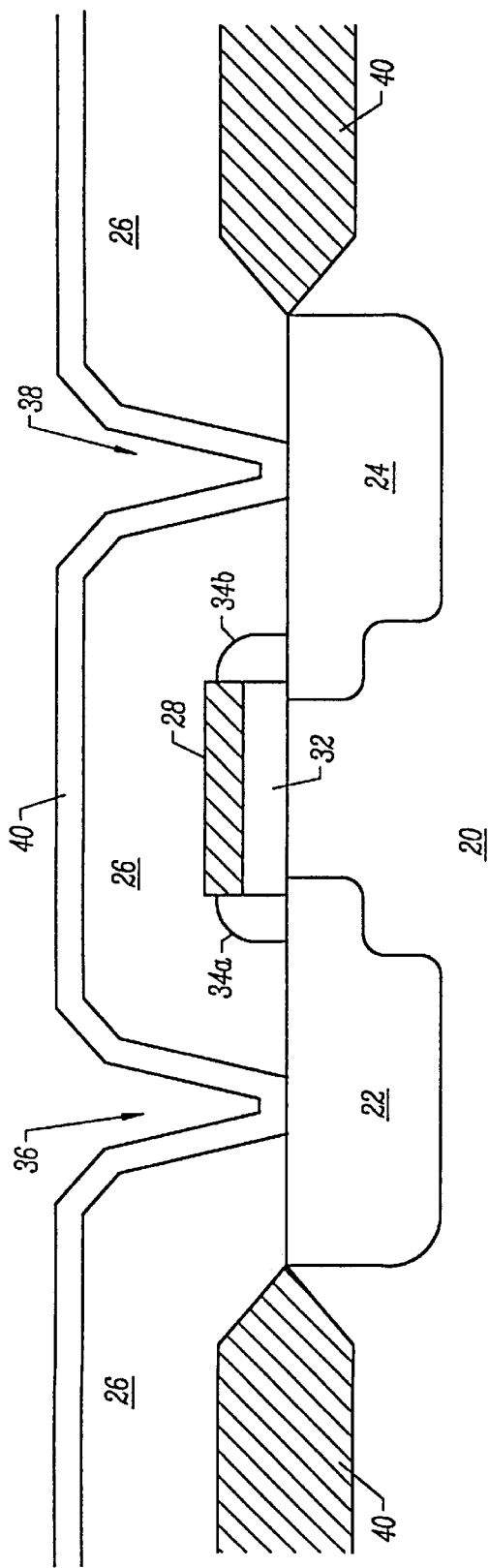
FIG. 2B shows a cross sectional view of a MOS transistor with a titanium nitride sublayer deposited at low temperature over the ILD layer.

FIG. 2B is a cross sectional view of a partially fabricated MOS semiconductor device of the present invention after low temperature deposition of a titanium nitride sublayer 40 onto dielectric layer 26. The titanium nitride sublayer 40 covers the horizontal and vertical profile of the dielectric layer 26. Notably, titanium nitride sublayer 40 conformally covers contact holes 36 and 38 with good step coverage. Generally, the purpose of this sublayer is to ensure that the overall titanium nitride barrier layer is conformal and has good step coverage, particularly when deposited in a contact hole or via having a high aspect ratio. For example, sublayer 40 is particularly useful when the width of the via or contact hole is less than about 0.5 μm and the aspect ratio is greater than about 2:1.

Preferably, the titanium nitride sublayer 40 is deposited at a temperature of between about 200° C. and about 300° C., more preferably between about 250° C. and about 300° C. and most preferably at about 280° C. Titanium nitride sublayers deposited at these temperatures generally have good step coverage (greater than about 70%) but have high resistivity at least after removal from the CVD environment. The thickness of the titanium nitride sublayer 40 is preferably between about 50 Å and about 600 Å thick, more preferably between about 100 Å and about 200 Å thick and most preferably between about 150 Å and about 200 Å thick.

Figure 2C:
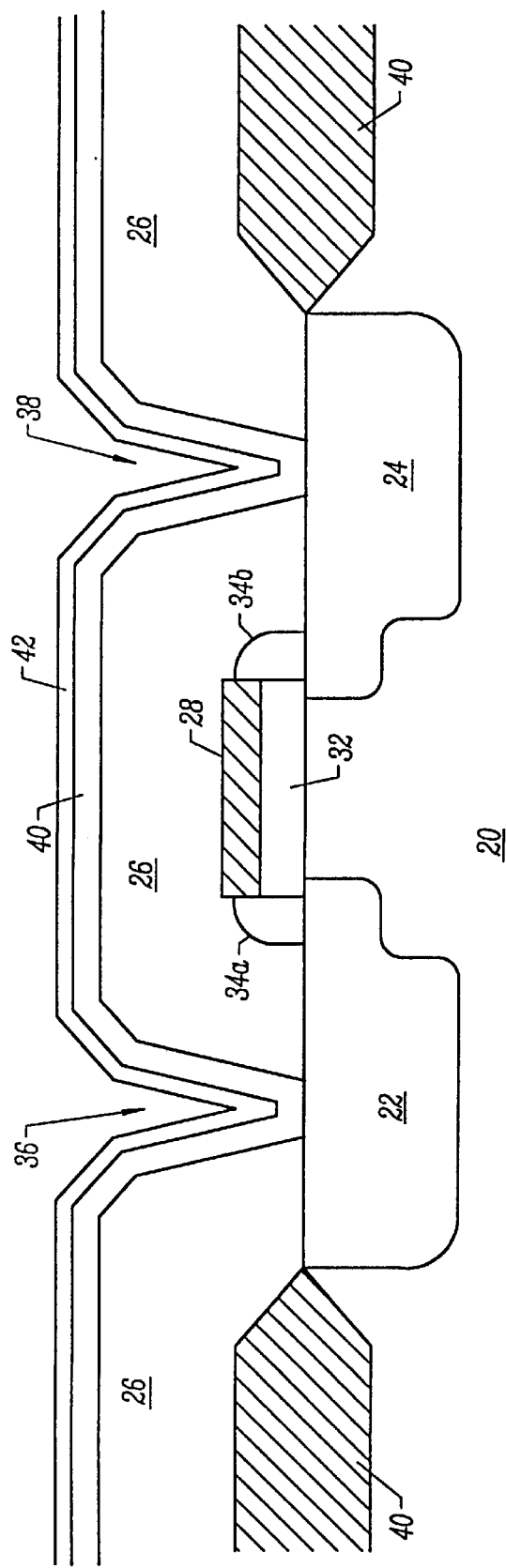
FIG. 2C shows a cross sectional view of a MOS transistor with a titanium nitride sublayer deposited at high temperature over a low temperature titanium nitride sublayer.

FIG. 2C is a cross sectional view of a partially fabricated CMOS semiconductor device of the instant invention after high temperature deposition of titanium nitride sublayer 42 onto low temperature titanium nitride sublayer 40. The titanium nitride sublayer 42 covers the horizontal and vertical profile of the low temperature titanium nitride sublayer 40. While sublayer 42 may not have as good a step coverage as sublayer 40 it will generally have a lower resistivity by virtue of the higher deposition temperature.

Preferably, the high temperature titanium nitride sublayer 42 is deposited at a temperature of between about 340° C. and about 500° C., more preferably between about 340° C. and about 400° C. and most preferably at about 350° C. The thickness of the titanium nitride sublayer 42 is between about 20 Å and about 200 Å thick, more preferably between about 20 Å and about 100 Å thick and most preferably between about 40 Å and about 50 Å thick.

The resistivity of the titanium nitride barrier layer consisting of low temperature sublayer 40 and high temperature sublayer 42 may vary between about 1000 μOhm-cm and about 200 μOhm-cm. The low temperature sublayer 40 may have a much higher resistivity that is between about 10,000 μOhm-cm and about 1200 μOhm-cm. The high temperature sublayer 42 may have a resistivity that is between about 200 μOhm-cm and about 600 μOhm-cm. The low temperature sublayer 40 has a step coverage of about between about 75% and about 95% when the aspect ratio of contact holes 36 and 38 is larger than about 3.5:1. The high temperature sublayer 42 may have a lower step coverage that is between about 20% and about 10% when the aspect ratio of contact holes 36 and 38 is larger than about 3.5:1. The step coverage of the composite titanium nitride barrier layer varies between about 80% and about 25% when the aspect ratio of contact holes 36 and 38 is larger than about 3.5:1.

Figure 2D:
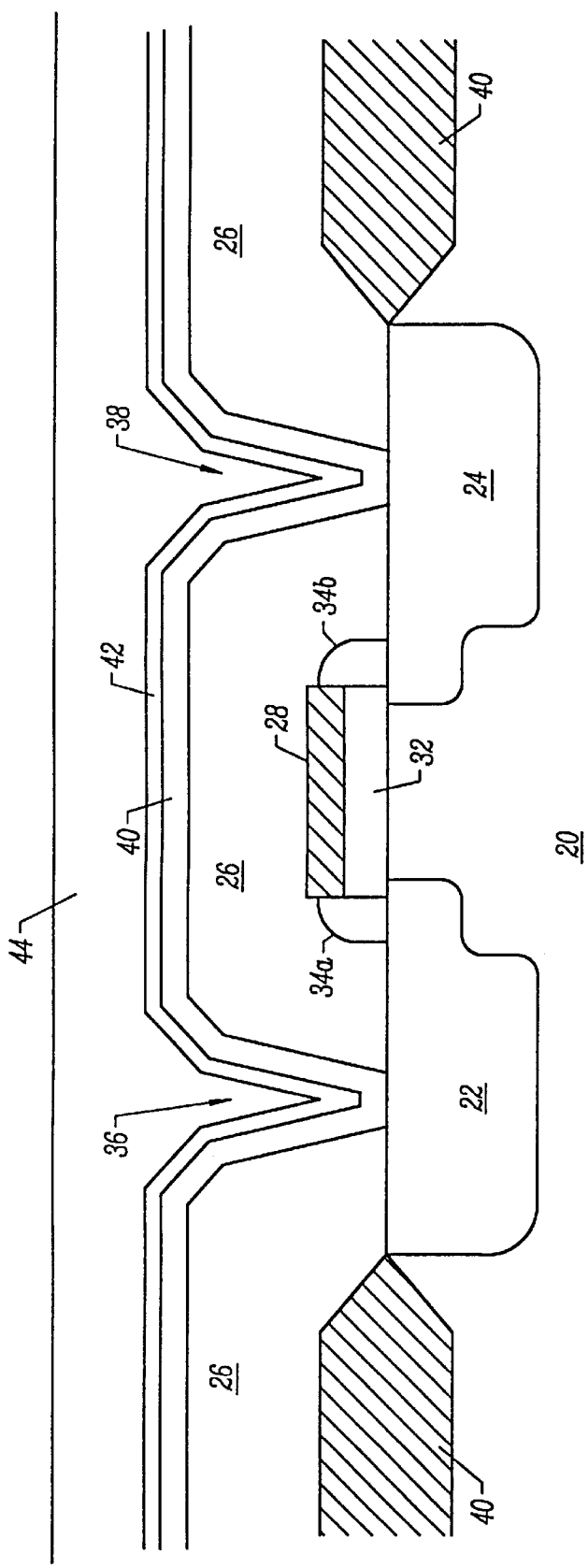
FIG. 2D shows a cross sectional view of a MOS transistor with a metal layer deposited over the ILD that completely fills the contact holes.

FIG. 2D is a cross sectional view of a partially fabricated CMOS semiconductor device of the present invention after metal layer 44 has been deposited over the titanium nitride barrier layer. The metal layer 44 completely fills the contact holes 36 and 38 and blankets the ILD layer 26. The metal layer 44 is chosen from a wide variety of materials useful in semiconductor devices and can be formed by a wide variety of processes such as CVD tungsten, CVD aluminum, CVD copper, force filled aluminum, sputter (PVD) aluminum and ion metal plasma (IMP) aluminum.

Figure 3A:
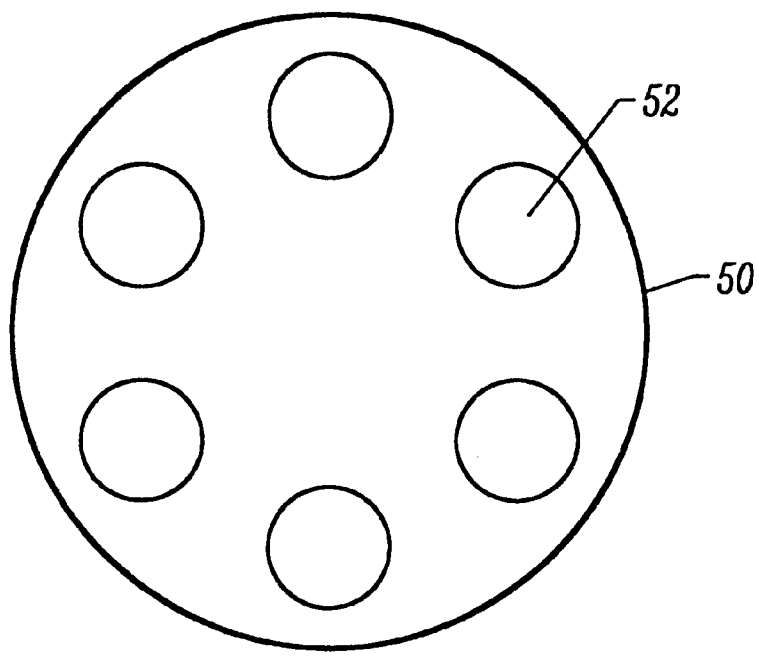
FIG. 3A is a top view of a rotating six pedestal CVD reactor.

FIG. 3A is an idealized top view of a six station rotating CVD reactor 50, the Connect II reactor, that is used in the instant invention, and which is available from Novellus Systems Inc., 3970 North First Street, San Jose, Calif. 95134. Each of the small circles 52 represents a pedestal on which an individual semiconductor wafer is mounted. The semiconductor wafers are input into the reactor on a particular pedestal which is then rotated through six stations that each possess a separate shower head and an independently controllable pedestal temperature. Furthermore, the amount of time that a wafer spends at each station can also be varied independently.

In a preferred embodiment, the gaseous mixture exiting an individual shower head in the six station rotating CVD reactor is of the same composition, flow rate and pressure. However, the residence time and the temperature at each of the stations can be varied independently. Preferably, low temperature titanium nitride deposition typically takes place over the first three or four stations while high temperature titanium nitride deposition is limited to the last one or two stations.

Figure 3B:
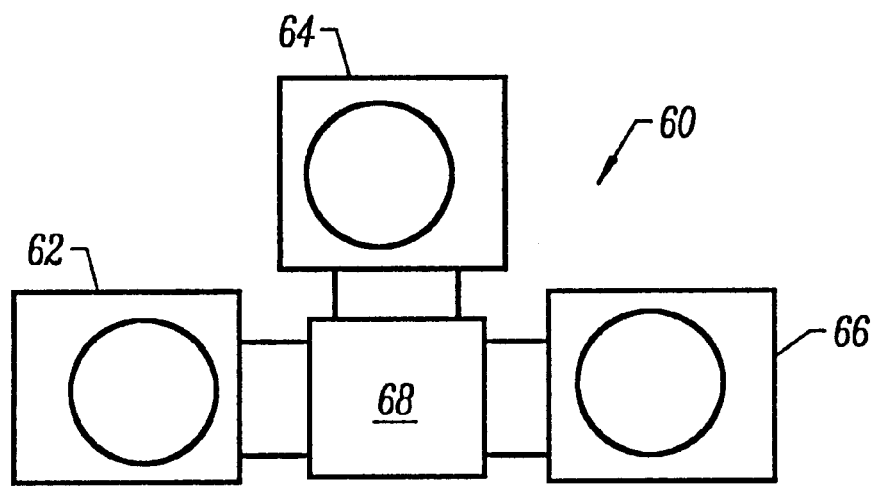
FIG. 3B is a top view of a three chamber CVD reactor.

FIG. 3B illustrates an alternative reactor configuration 60 that can be used in the present invention which has three isolated chambers 62, 64 and 66 and a transfer station 68 for shifting the semiconductor wafers from one chamber to the next chamber. Although FIG. 3B shows a reactor with three separate single wafer stations, any reactor that contains two or more wafer stations is potentially useful in the instant invention. In a preferred embodiment, a semiconductor wafer is first inserted into a first single wafer station 62 where low temperature deposition of titanium nitride takes place. Ultimately, the wafer is moved to a final single wafer station 66 through a transfer station 68 where high temperature deposition of titanium nitride occurs. At a intermediate station 64 high, low or intermediate temperature deposition of titanium nitride can take place. Thus, a titanium nitride barrier layer comprised of three or more sublayers deposited at differing temperatures is within the scope of the instant invention.

Regardless of the reactor configuration used the method of the instant invention requires certain titanium nitride deposition conditions. If titanium nitride barrier sublayers are formed through MO-CVD, a mixture of a organotitanium compound which is usually TDEAT or TDMAT, a carrier gas which is typically helium and ammonia is employed. In a preferred embodiment, the pressure of the gaseous mixture varies between about 0.5 torr and about 80 torr and is most preferably about 30 torr. The flow rate of ammonia is preferably between about 3,000 sccm and about 40,000 sccm and is most preferably about 20,000 sccm. The flow rate of the organotitanium compound (either TDEAT or TDMAT) is preferably between about 0.1 sccm and 1.0 sccm and is most preferably about 0.2 sccm.

EXAMPLES

The following Examples are offered solely for the purpose of illustrating the features of the present invention and are not to be considered as limiting the scope of the present invention in any way.

Example 1

Figure 4A:
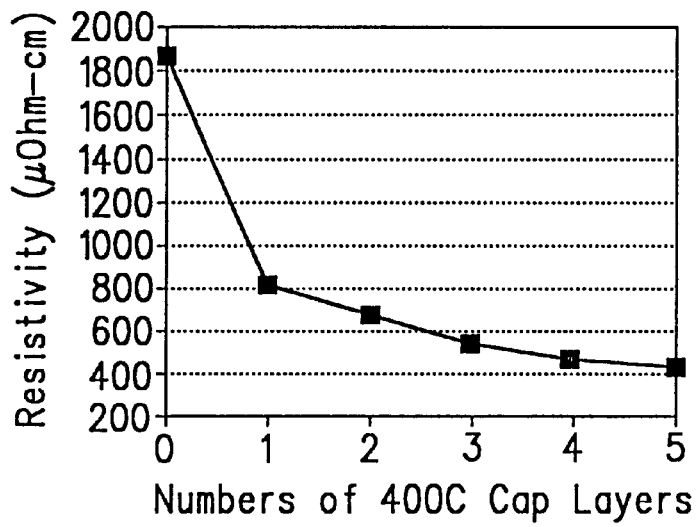
FIG. 4A illustrates the effect of increasing the number of high temperature titanium nitride deposition steps on the resistivity of the titanium nitride barrier layer when using a Novellus Connect II reactor to process a semiconductor wafer.
Figure 4B:
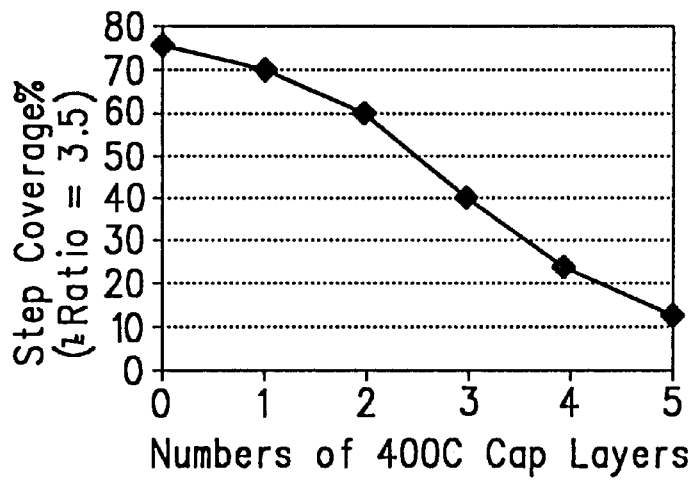
FIG. 4B illustrates the effect of increasing the number of high temperature titanium nitride deposition steps on the step coverage of the titanium nitride barrier layer when using a Novellus Connect II reactor to process a semiconductor wafer.

FIGS. 4A and 4B illustrate the effect of increasing the number of high temperature titanium nitride deposition steps on the resistivity and step coverage respectively of the titanium nitride barrier layer when using a Novellus Connect II reactor to process a semiconductor wafer. The data presented in these graphs was obtained by depositing titanium nitride in two sublayers on a silicide doped single crystal silicon having a hole of depth 1.3 μm and width of 0.37 μm with an aspect ratio of about 3.5:1. The lower sublayer(s) were deposited at about 300° C. and the higher sublayer(s) were deposited at about 400° C. The time that the substrate resided at each station was about 16 seconds.

FIGS. 4A and 4b indicates that the optimal balance between step coverage and low resistivity is achieved when the number of high temperature deposition steps is one because the resistivity drops substantially from about 1900 $\mu$Ohm-cm to about 800 $\mu$Ohm-cm while the step coverage is diminished only slightly from about 75% to about 70%. Two high temperature deposition steps also have a good balance between step coverage and resistivity because the resistivity drops to about 650 $\mu$Ohm-cm while the step coverage is still about 60%. However, when the number of high temperature deposition steps is greater than two the step coverage drops off precipitously and is not matched by decreased resistivity. Thus, when the number of high temperature deposition steps is one or two a low resistivity and highly conformal titanium nitride barrier layer can be obtained.

Example 2

Figure 5A:
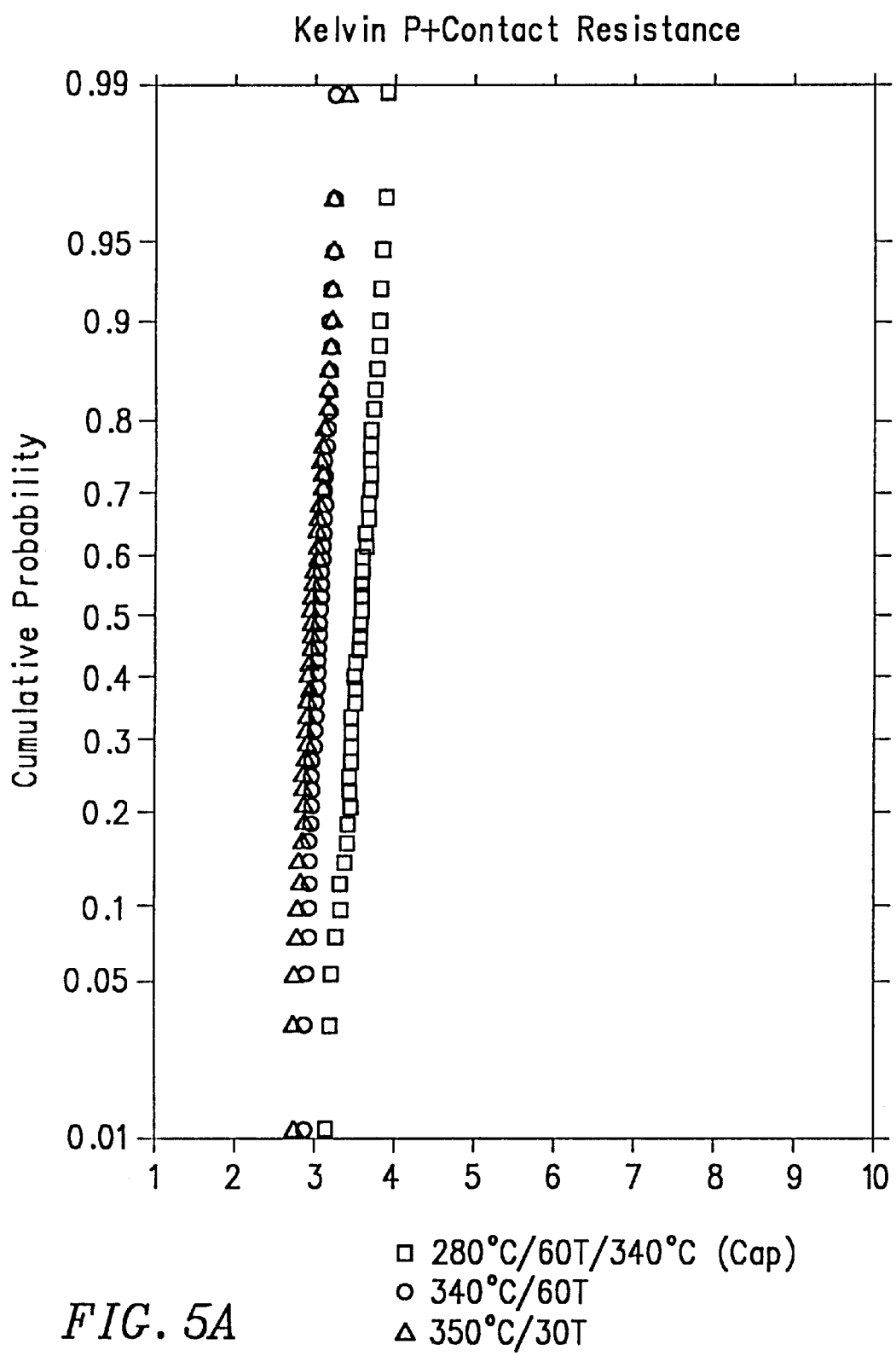
FIG. 5A compares the resistivity of various titanium nitride barrier layers deposited at different temperatures in a 0.25 $\mu$m integrated circuit where the diameter of the contact hole is 0.35 $\mu$m.
Figure 5B:
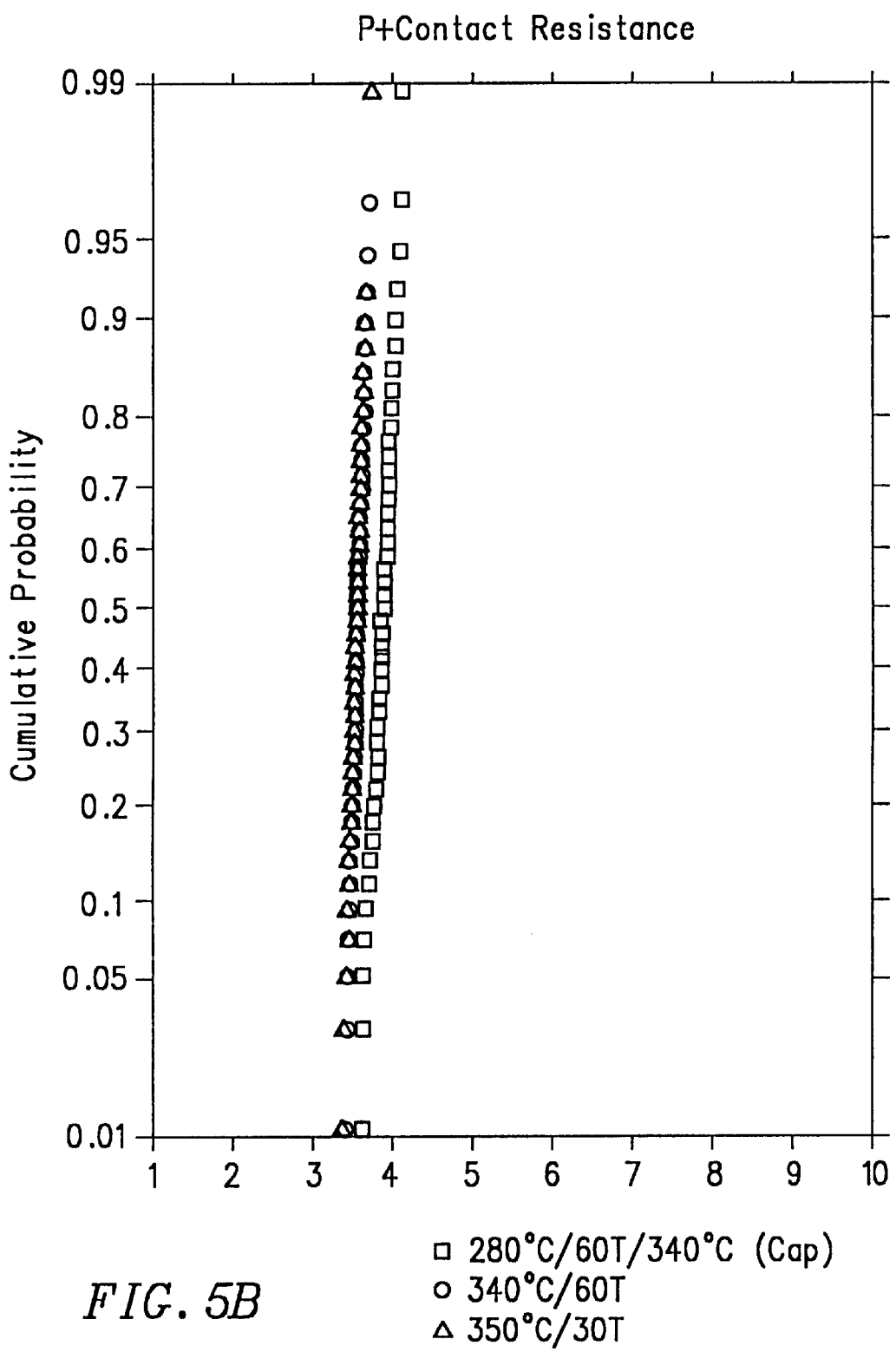
FIG. 5B compares the resistivity of various titanium nitride barrier layers deposited at different temperatures in a 0.25 $\mu$m integrated circuit where the diameter of the contact hole is 0.40 $\mu$m.

FIGS. 5A and 5B compare directly the resistivity of various titanium nitride barrier layers deposited at different temperatures on a cobalt silicide ($CoSi_2$) layer that covers gate source and drain of a 0.25 $\mu$m integrated circuit. In FIG. 5A the width of the contact hole is 0.35 $\mu$m and in FIG. 5B the width of the contact hole is 0.4 $\mu$m. As can be seen from FIGS. 5A and 5B the resistivity of the two part titanium barrier layer (square) derived from the method of the instant invention is only slightly inferior to high temperature titanium nitride barrier layers deposited at 340° C. (circle) or 350° C. (triangle). Furthermore, though not shown in the graph, low temperature titanium nitride barrier layers have much worse resistivity than material derived from the instant invention.

The titanium nitride used to generate the data presented in FIGS. 5A and 5B was deposited as follows.

Square (□) Deposition Temperature=280° C. (bottom layer).

Deposition Temperature=340° C. (top layer).

Pressure=60 torr.

Circle (O) Deposition Temperature=340° C.

Pressure=60 torr.

Triangle (Δ) Deposition Temperature=350° C.

Pressure=30 torr.

The axes on plots of FIGS. 5A and 5B are as follows.

Kelvin P+Contact Resistance=individual contact resistance in Ohms between a single transistor's gate and source or drain through the first metal to the substrate in an integrated circuit. This measurement is made on only one MOS device of a given integrated circuit.

Cumulative Probability=The percentage of contact resistance measurements that fall below the associated resistance measurement. In these examples, approximately 50 die were measured as described above. The resistance measurement of each die varied somewhat from the measurements of the other die. This distribution is represented on the cumulative probability axis. For example, the resistance associated with 0.5 cumulative probability is the resistance below which 50% of the remaining resistance readings lie. Similarly, the resistance measurement associated with 0.99 cumulative probability is the resistance below which 99% of the remaining resistance readings lie.

CONCLUSION

While the invention has been described in some detail to facilitate understanding, it will be apparent that certain changes and modifications may be practiced within the scope of the appended claims. For example, while the specification has been limited to a discussion of titanium nitride barrier layer, there is in principle no reason why the application could not be applied to other chemically or physically similar barrier materials (e.g. tantalum silicon nitride). Therefore, the above described embodiments should be considered illustrative rather than restrictive and the instant invention is not limited to the details given herein but may be modified within the scope of the appended claims.

What is claimed is:

1. A semiconductor device including a titanium nitride barrier layer comprising: a first titanium nitride sublayer having a first resistivity and a second titanium nitride sublayer having a second resistivity, wherein the titanium nitride barrier layer is formed as follows:

depositing the first titanium nitride sublayer of a first resistivity on a partially fabricated electronic device at a first temperature; and depositing the second titanium nitride sublayer of a second resistivity on said first titanium nitride sublayer at a second temperature wherein said second temperature is greater than said first temperature and said second resistivity is lower than said first resistivity.

2. The semiconductor device of claim 1 wherein said first titanium nitride sublayer is between about 50 Å and about 600 Å thick.

3. The semiconductor device of claim 1 wherein said second titanium nitride sublayer is between about 20 Å and about 200 Å thick.

4. A semiconductor device including a titanium nitride barrier layer formed on a dielectric layer, said titanium nitride barrier layer comprising:

a first titanium nitride sublayer having a first resistivity and a first density deposited on said dielectric layer; and a second titanium nitride sublayer having a second resistivity and a second density deposited on said first titanium nitride sublayer wherein said first resistivity is greater than said second resistivity and said first density is lower than said second density.

5. The semiconductor device of claim 4 wherein said first titanium nitride sublayer is more porous than said second titanium nitride sublayer.

6. The semiconductor device of claim 4 wherein said semiconductor device has a aspect ratio of about 3.5:1 and said titanium nitride barrier layer has a step coverage of at least about 60%.

7. The semiconductor device of claim 4 wherein said first titanium nitride sublayer has a first resistivity between about 2000 $\mu$Ohm-cm and about 1600 $\mu$Ohm-cm.

8. The semiconductor device of claim 4 wherein said second titanium nitride sublayer has a second resistivity between about 200 $\mu$Ohm-cm and about 600 $\mu$Ohm-cm.

9. The semiconductor device of claim 4 wherein said titanium nitride barrier layer has a resistivity between about 1000 $\mu$Ohm-cm and about 200 $\mu$Ohm-cm.

10. The semiconductor device of claim 4 wherein said first titanium nitride sublayer is between about 50 Å and about 600 Å thick.

11. The semiconductor device of claim 4 wherein said second titanium nitride sublayer is between about 20 Å and about 200 Å thick.

12. The semiconductor device of claim 1 wherein said second temperature is greater than said first temperature by at least about 50° C.

13. The semiconductor device of claim 1 wherein said titanium nitride barrier layer is formed through a metal organic chemical vapor deposition of a mixture comprised of a organotitanium compound, a carrier gas and ammonia.

14. The semiconductor device of claim 13 wherein the pressure of said mixture is between about 0.5 torr and about 80 torr.

15. The semiconductor device of claim 13 wherein the flow rate of said ammonia is between about 3,000 sccm and about 40,000 sccm.

16. The semiconductor device of claim 13 wherein the flow rate of said organotitanium compound is between about 0.1 sccm and about 1.0 sccm.

17. The semiconductor device of claim 13 wherein said organotitanium compound is selected from the group consisting of tetrakis (diethylamido) titanium and tetrakis (dimethylamido) titanium.

18. The semiconductor device of claim 1 wherein said titanium nitride barrier layer is formed on a dielectric layer of said partially fabricated electronic device, said dielectric layer having vias or contact holes.

19. The semiconductor device of claim 1 wherein said first temperature is between about 200° C. and about 300° C.

20. The semiconductor device of claim 19 wherein said first temperature is between about 250° C. and about 300° C.

21. The semiconductor device of claim 11 wherein said second temperature is between about 340° C. and about 500° C.

22. The semiconductor device of claim 21 wherein said second temperature is between about 340° C. and about 400° C.

23. The semiconductor device of claim 2 wherein said first titanium nitride sublayer is between about 100 Å and about 200 Å thick.

24. The semiconductor device of claim 3 wherein said second titanium nitride sublayer is between about 20 Å and about 100 Å thick.

25. The semiconductor device of claim 1 wherein said first titanium nitride sublayer has a first resistivity between about 2000 $\mu$Ohm-cm and about 1600 $\mu$Ohm-cm.

26. The semiconductor device of claim 1 wherein said second titanium nitride sublayer has a second resistivity between about 200 $\mu$Ohm-cm and about 600 $\mu$Ohm-cm.

27. The semiconductor device of claim 1 wherein said titanium nitride barrier layer has a resistivity between about 1000 $\mu$Ohm-cm and about 200 $\mu$Ohm-cm.

28. The semiconductor device of claim 1 wherein said first titanium nitride sublayer is more porous than said second titanium nitride sublayer.

29. The semiconductor device of claim 1 wherein said semiconductor device has a aspect ratio of about 3.5:1 and said titanium nitride barrier layer has a step coverage of at least about 60%.

30. The semiconductor device of claim 1 wherein said titanium nitride barrier layer is formed in a multi-stage chemical vapor deposition reactor whereby said partially fabricated electronic device is moved between stages and wherein said first titanium nitride sublayer is formed in one or more of said stages and said second titanium nitride sublayer is formed in one or more different stages.

31. The semiconductor device of claim 30 wherein said multi-stage chemical vapor deposition reactor contains between two and six stages.

32. The semiconductor device of claim 31 wherein said second titanium nitride sublayer is deposited in not more than two stages of said multi-stage chemical vapor deposition reactor.

33. The semiconductor device of claim 10 wherein said first titanium nitride sublayer is between about 100 Å and about 200 Å thick.

34. The semiconductor device of claim 11 wherein said second titanium nitride sublayer is between about 20 Å and about 100 Å thick.

* * * * *